US010901026B2

United States Patent
Kranz et al.

(10) Patent No.: US 10,901,026 B2
(45) Date of Patent: Jan. 26, 2021

(54) PASSIVE HARMONIC FILTER POWER QUALITY MONITOR AND COMMUNICATIONS DEVICE

(71) Applicant: TCI, LLC, Germantown, WI (US)

(72) Inventors: William Kranz, Fox Point, WI (US); Ian Wallace, Whitefish Bay, WI (US); Skyler Sandlin, Port Washington, WI (US); Ashish Bendre, Shorewood, WI (US); James Pomes, Whitefish Bay, WI (US)

(73) Assignee: TCI, LLC, Germantown, WI (US)

(*) Notice: Subject to any disclaimer, the term of this patent is extended or adjusted under 35 U.S.C. 154(b) by 147 days.

(21) Appl. No.: 16/134,593

(22) Filed: Sep. 18, 2018

(65) Prior Publication Data
US 2020/0088783 A1 Mar. 19, 2020

(51) Int. Cl.
*G01R 31/26* (2020.01)
*H02M 1/42* (2007.01)
(Continued)

(52) U.S. Cl.
CPC ......... *G01R 31/2632* (2013.01); *G01R 31/40* (2013.01); *H02M 1/4266* (2013.01); *H02M 1/44* (2013.01); *H02M 7/06* (2013.01)

(58) Field of Classification Search
CPC .... G01R 31/2632; G01R 31/40; G01R 23/20; H02M 1/126; H02M 1/4266; H02M 1/44; H02M 7/06
(Continued)

(56) References Cited

U.S. PATENT DOCUMENTS

| 7,502,238 | B2* | 3/2009 | Wei ...................... H02M 1/126 318/807 |
| 8,363,433 | B2* | 1/2013 | Zhang ...................... H02J 3/01 363/39 |

(Continued)

FOREIGN PATENT DOCUMENTS

| CN | 102403957 A | * | 4/2012 |
| CN | 107134777 A | * | 9/2017 |

OTHER PUBLICATIONS

Anooja et al., Passive Filter for Harmonic Mitigation of Power Diode Rectifier and SCR Rectifier Fed Loads. International Journal of Scientific & Engineering Research, vol. 4, Issue 6, Jun. 2013, pp. 1615-1621 (Year: 2013).*

(Continued)

*Primary Examiner* — Patrick Assouad
*Assistant Examiner* — Sean Curtis
(74) *Attorney, Agent, or Firm* — Nicholas A. Kees; Godfrey & Kahn, S.C.

(57) ABSTRACT

A method and apparatus for detection of a failure of a rectifier connected to a passive harmonic filter with a tuned circuit reactor, or of the filter itself, using low cost voltage sensing, modeling of reactor resistance and saturable inductance, and a mathematical integration. The harmonic spectrum of the rectifier current is used to determine an estimate of the rectifier impedance. A template of expected rectifier current is calculated, and compared against a rectifier current calculated on the basis of sensed voltages, to generate a difference signal. The difference signal is compared against a predetermined fault threshold to determine if an error has occurred. The apparatus includes a DSP obtaining the voltages of the source and load, and the tuned circuit reactor voltage, and configured to compare the currents calculated (Continued)

from the actual voltages with the currents in the template, and to thereby determine whether to annunciate a fault.

1 Claim, 8 Drawing Sheets

(51) Int. Cl.
*G01R 31/40* (2020.01)
*H02M 1/44* (2007.01)
*H02M 7/06* (2006.01)

(58) Field of Classification Search
USPC .................................................. 324/762.07
See application file for complete search history.

(56) References Cited

U.S. PATENT DOCUMENTS

| | | | | |
|---|---|---|---|---|
| 8,513,951 | B2* | 8/2013 | Wunderlich | G01R 31/50 324/500 |
| 8,674,544 | B2 | 3/2014 | Rada et al. | |
| 8,773,827 | B2 | 7/2014 | Kiko | |
| 8,924,170 | B2* | 12/2014 | Bengtsson | H02M 7/1623 702/58 |
| 8,994,226 | B2* | 3/2015 | Liang | H03H 7/0153 307/105 |
| 9,013,060 | B2 | 4/2015 | Katru et al. | |
| 9,257,894 | B2* | 2/2016 | Wallace | H02M 1/12 |
| 9,503,042 | B2* | 11/2016 | Liang | H03H 7/0153 |
| 10,050,549 | B2* | 8/2018 | Gonzalez-Espin | H02M 7/06 |
| 10,135,329 | B2* | 11/2018 | Li | H01F 38/14 |
| 2010/0327823 | A1* | 12/2010 | Nisenblat | H02J 3/1828 323/206 |
| 2012/0182089 | A1* | 7/2012 | Liang | H03H 7/0153 333/168 |
| 2015/0091640 | A1* | 4/2015 | Wallace | H03H 7/427 327/551 |
| 2015/0171818 | A1* | 6/2015 | Liang | H03H 7/0138 333/105 |
| 2017/0222571 | A1* | 8/2017 | Gonzalez-Espin | H02M 7/06 |
| 2018/0174743 | A1* | 6/2018 | Negrete Hernandez | H05B 6/44 |
| 2020/0067352 | A1* | 2/2020 | Kothari | H02J 50/27 |
| 2020/0088783 | A1* | 3/2020 | Kranz | H02M 1/44 |

OTHER PUBLICATIONS

Kazem, Hussein A., Harmonic Mitigation Techniques Applied to Power Distribution Networks.Hindawi Publishing Corporation Advances in Power Electronics vol. 2013, Article ID 591680, 10 pages (Year: 2013).*

Mirrus InSight Power Meter and Alarm Monitor; http://www.mirusinternational.com/insight.php; Mirus Internatoinal, Inc.; captured Dec. 18, 2018.

* cited by examiner

PASSIVE HARMONIC FILTER POWER QUALITY MONITOR AND COMMUNICATIONS DEVICE

FIELD OF THE INVENTION

The present invention relates generally to electrical filters for power applications, and more specifically to passive harmonic electrical filters used to resolve issues with non-linear electrical loads that create harmonic voltages and currents on a utility grid.

BACKGROUND

Electrical passive harmonic filters are used in power quality applications on single-phase or three-phase electrical grids on a wide range of voltages (e.g. 208 V, 230 V, 277V, 480 V, 600 V, 690V). The filters are applied to non-linear, industrial loads that create harmonic current and voltage distortion on the utility grid. Utility companies have developed power quality standards with which industrial customers must comply in order to reduce waste heat losses on the electrical grids and to reduce the effects of electrical distortion on neighboring utility customers. Conventional passive harmonic filters that address these power quality requirements are comprised of three components. A parallel, shunt-connected tuned electrical 5th harmonic inductive capacitive (LC) circuit sources the harmonic current required by industrial, non-linear harmonic loads. A series-connected line reactor lowers the overall harmonic current required by the load. An optional tuned circuit control contactor turns on or off the tuned circuit harmonic correction based on load conditions.

These harmonic filters have historically been passive devices with zero or minimal internal electronic control beyond a basic relay control contactor. The control contactor accepts external commands to turn on or off the harmonic correction based on load conditions. With the lack of any internal control electronics, passive harmonic filters have no mechanism to detect and annunciate an imminent equipment failure of either the passive filter itself or any equipment connected downstream of the passive filter.

For example, U.S. Pat. No. 9,013,060 describes monitoring and controlling an electric load using a current sensor and monitor/communications board. It does not discuss control and monitoring of a passive filter or any application to any passive filter-tuned circuit. U.S. Pat. No. 8,674,544 describes dynamic power factor correction for single-phase systems, rather than three-phase systems, and also does not disclose control or monitoring of passive filters. U.S. Pat. No. 8,773,827 describes converting a standard circuit breaker into a networked device to control loads. The InSight™ power meter and alarm monitor, from Mirus International, Inc., as described at http://www.mirusinternational.com/insight.php (last visited Aug. 24, 2018), claims to monitor a capacitor bank, but does not appear to predict a near-term failure or end of life for connected components. This product also identifies relay contactor control as a feature but does not describe using load current or source power factor as a means to control the tuned circuit contactor.

This invention relates to improvements to some of the apparatus described above, and to solutions to some of the problems raised or not solved thereby.

SUMMARY OF THE INVENTION

The present invention provides a method and apparatus for detection of a failure of a rectifier load connected downstream of a passive harmonic filter, the rectifier load having a harmonic spectrum. The method includes the use of the harmonic spectrum of the rectifier current to determine an estimate of the drive rectifier impedance. A template of expected rectifier current is calculated. The expected rectifier current is compared against a measured current. A difference signal is determined, based upon the difference between the expected rectifier current and the measured current. Thus the determination is made whether an error has occurred. The difference signal may be passed through a low pass filter to create a filtered signal, and compared against a fault threshold to determine if an error has occurred. Multiple fault thresholds may be implemented to detect both a soft imminent failure and a hard failure.

The apparatus includes a Digital Signal Processor (DSP) obtaining the voltages of the source, and the voltages of the load or the line reactor taps, and the voltage of the node between the tuned circuit reactor and the tuned circuit capacitor, and using that information to calculate estimated currents in the line reactor and tuned circuit reactor, using the reactor inductances and a mathematical integration. With the line reactor currents and tuned circuit reactor currents known, the load currents can also be calculated, so that all voltages and currents within the harmonic filter are known, and thus the voltage and current applied to the connected downstream equipment are also known. Then the template of the expected voltages and currents is used to compare the actual voltages with the template. A fault is annunciated if the voltages or currents are outside of the expected values in the template.

Other objects and advantages of the invention will become apparent hereinafter.

DETAILED DESCRIPTION

Many applications of a passive harmonic filter are to Variable Frequency Drive (VFD) loads with six-pulse-rectifier inputs. A standard six-pulse-rectifier VFD does not directly sense rectifier input currents as a failure detection mechanism.

According to the present disclosure, the application of a monitoring device to a passive filter allows the passive filter to detect and annunciate a diode failure in the VFD rectifier load by directly monitoring the passive filter load current into the VFD rectifier.

Figure 1A:
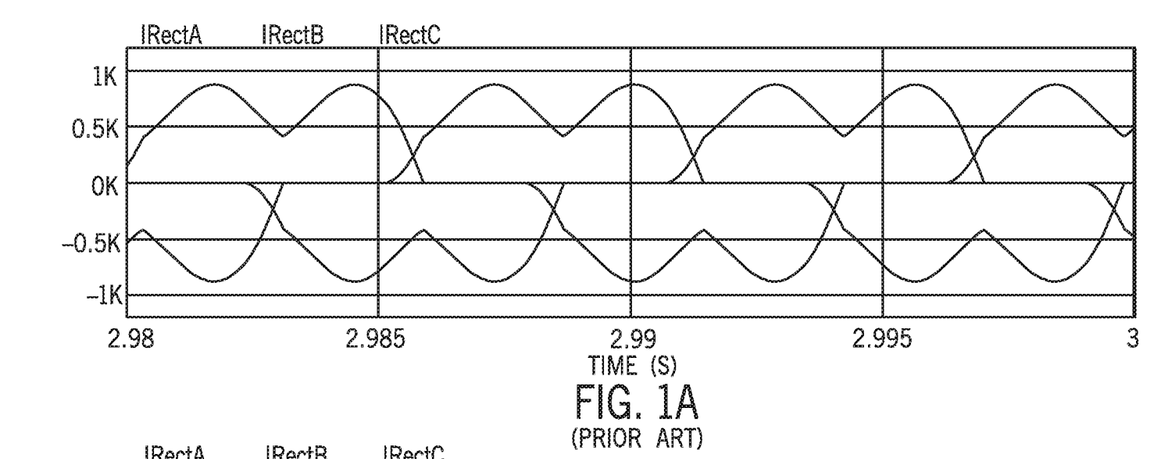
FIG. 1A is a graph showing a load current waveform for a correctly functioning rectifier load connected downstream of a passive harmonic filter.
Figure 1B:
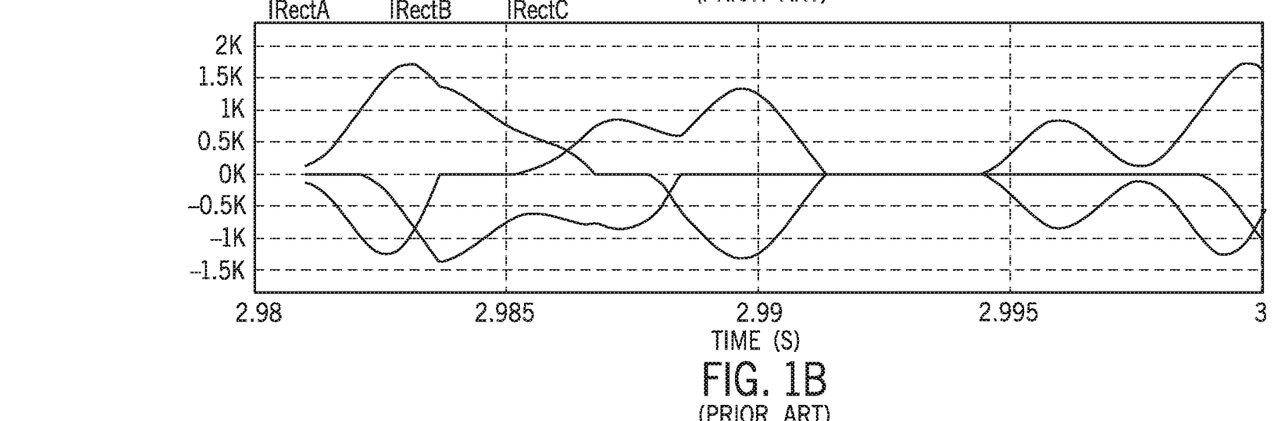
FIG. 1B is a graph showing a load current waveform for a malfunctioning rectifier load connected downstream of a passive harmonic filter.

FIG. 1A shows a passive filter load current for a conventional, correctly-operating, rectifier load connected downstream from a passive harmonic filter. FIG. 1B shows the rectifier current for a rectifier load that is damaged or malfunctioning.

Figure 2:
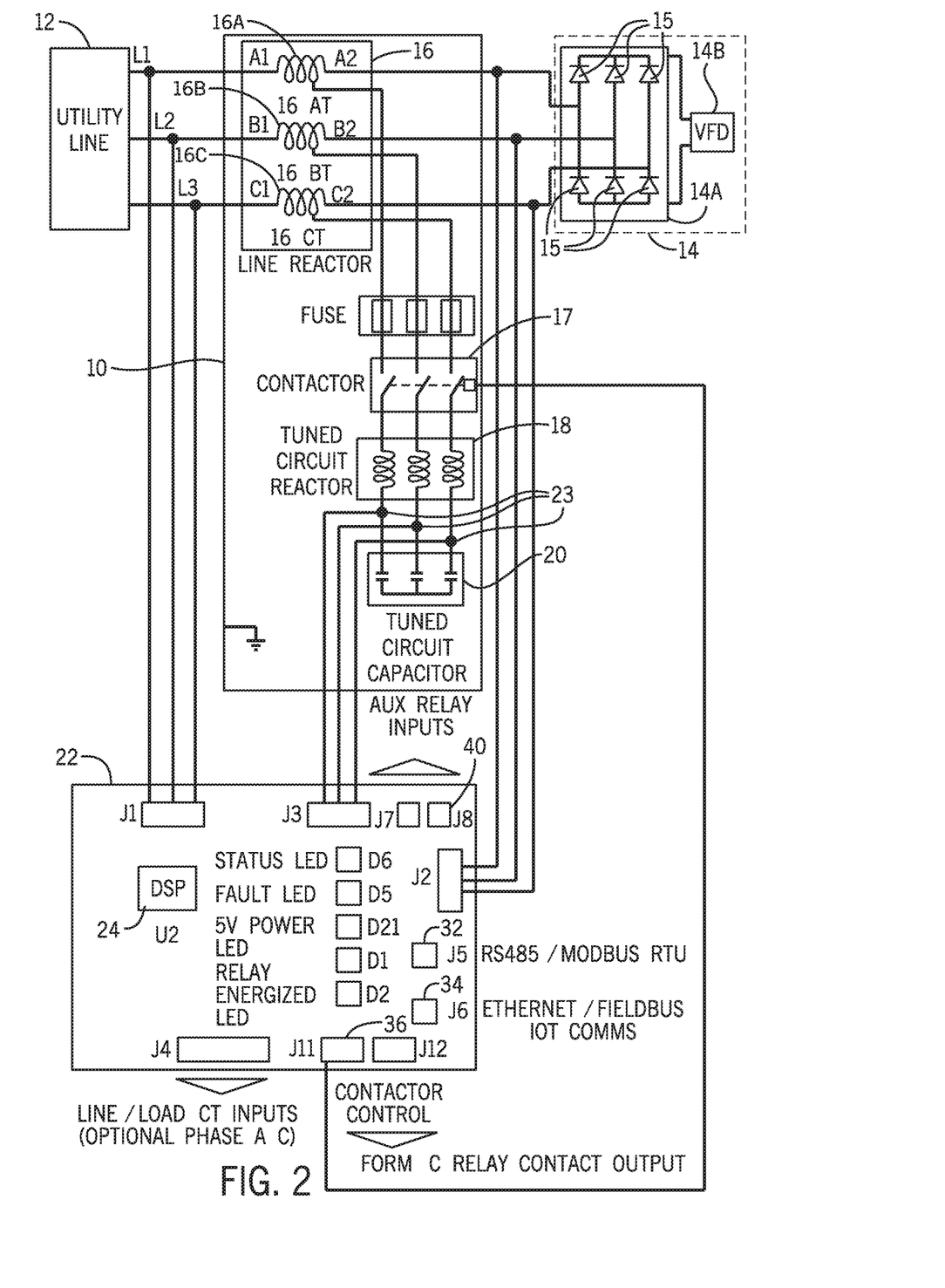
FIG. 2 is a schematic view of a passive harmonic filter having a controller connected thereto, according to one embodiment of the invention.

Referring to FIG. 2, there is shown a generally conventional passive harmonic filter 10 connected between a power source or line 12 and a load 14. As indicated above, generally the load 14 is assumed to be a rectifier 14A leading to a DC load, such as a VFD 14B. Among other elements, rectifier 14A includes multiple diodes 15. Further as described above, the filter 10 functions to address power quality issues caused by industrial loads, such as large electric motors, connected to utility power lines. As such, in a standard three-phase system, the filter 10 includes a three-phase line reactor 16 connected in series between the line 12 and the load 14, having individual inductors or reactors 16A, 16B and 16C. Each of the inductors 16A, 16B and 16C includes a respective inductor tap 16AT, 16BT and 16CT, connected, through a contactor 17, to a three-phase tuned circuit reactor 18 in series with a three-phase tuned circuit capacitor 20.

As shown in FIG. 2, according to the present invention, a monitor or controller device 22 is applied to the passive harmonic filter 10, as follows. Controller device 22 is connected to line input lines L1, L2 and L3 so as to obtain the input voltages from the power source 12. Controller device 22 is further connected to load lines T1, T2 and T3, so as to obtain the voltages applied to the load 14. Controller device 22 is also connected to the nodes 23 between the tuned circuit reactors 18 and the tuned circuit capacitors 20, so as to obtain the voltage at that point. Controller device 22 is may be further connected to the contactor 17, so as to enable the controller to turn on or off the tuned circuit reactors 18 and capacitors 20 based on load conditions. Controller device 22 includes a digital signal processor DSP 24, as well as a serial connection J5, and an Ethernet connection J6, to enable the controller to communicate the annunciation. Controller device 22 may also include physical indicators, such as light indicators, including Status LED D5, Fault LED D6, 5-volt power supply indicator LED D21, contactor control relay status LED D1, and fault status relay status LED D2, to act as indicators of the various faults and statuses.

Figure 3:
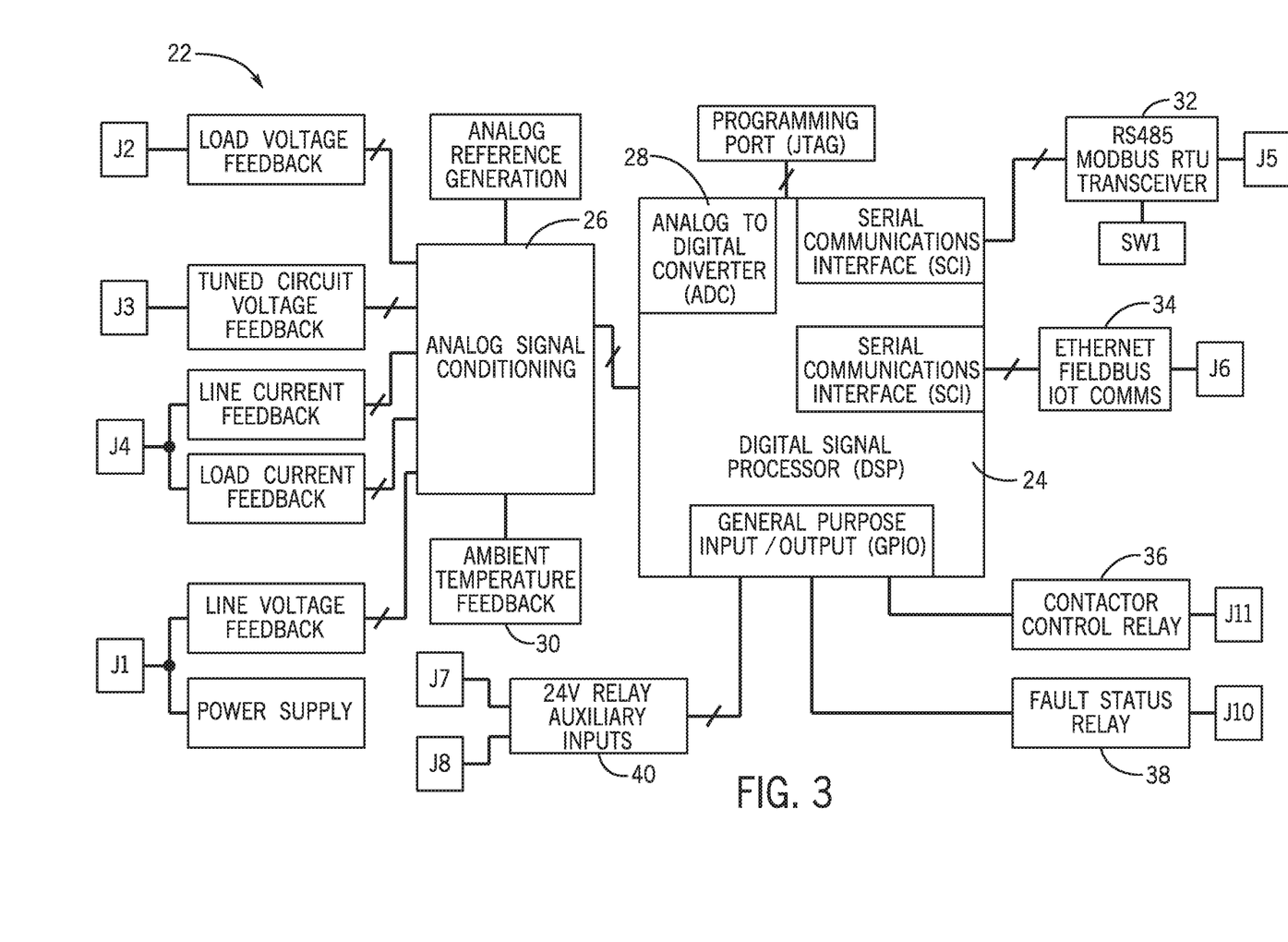
FIG. 3 is a schematic circuit diagram showing the controller shown in FIG. 1 as a device connected to and including a digital signal processor according to an embodiment of the invention.

As shown schematically in FIG. 3, controller device 22 includes the digital signal processor DSP 24, connected as described in reference to FIG. 2. Connected to the DSP 24 are analog signal conditioning circuits 26 used to scale and bias the physical system voltages and currents to levels appropriate for reading by an analog-to-digital converter module 28 in the DSP. The analog-to-digital converter module 28 of the controller device 22 also has an ambient board temperature sensor and channel 30 for detecting over-temperature conditions at or near the controller device. The DSP 24 is also connected to a basic serial transceiver circuit 32 that implements the physical layer of an industrial fieldbus. The DSP 24 is also connected to a secondary Ethernet processor 34 that implements an industrial Ethernet and Industrial Internet of Things (IIoT) communications interface. For local control of the passive harmonic tuned circuit contactor 17 (FIG. 2), the controller device 22 has two onboard relay outputs 36, 38 and may also support auxiliary relay input channels, such as by means of a connector 40.

Since the inductance of the line reactor 16 and the tuned circuit reactor 18 are known, once the voltages across the line reactor and the tuned circuit are known, the current through the line reactor and the tuned circuit reactor may be calculated. Calculating the system currents is very advantageous over measuring those currents, since the means for measuring current at that point, generally a current transformer or Rogowski coil, are much more expensive than measuring the identified voltages and running the calculations.

Thus, according to the present disclosure, detection of the failure of some part of the load 14, such as one of the diodes 15, is accomplished by using the harmonic spectrum of the rectifier current to determine an estimate of the drive rectifier impedance. Once the drive rectifier impedance is determined, a template of expected rectifier current is calculated. The expected template rectifier current is compared against the calculated current and an error signal or difference signal is generated. That difference signal is low pass filtered and compared against a fault threshold to determine if a failure has occurred. Multiple thresholds may be implemented to detect both a soft or imminent failure, and a hard failure.

In addition to the template-current methodology of detecting a rectifier failure, the harmonic spectrum content of the VFD rectifier current can be monitored for the presence of even harmonics in order to detect a failure in the VFD rectifier 14A. Even current harmonics are generated when the upper and lower halves of the continuous domain current waveform are not symmetrical, such as when one of the diodes 15 of the rectifier 14A has failed and is no longer conducting.

In addition to detecting a failure in the rectifier 14A, it is possible to detect a downstream failure of a motor connected to the VFD 14B, by analyzing the harmonic content of the VFD input current. Further, the condition of the internal components of the passive filter 10 may be monitored, based on current sensing and voltage sensing.

The reactive current generated by the passive harmonic filter 10 to correct the power factor is based on the utility source voltage and the designed tuned circuit capacitance value. Using the voltage sensing and current calculations implemented by the monitoring device 22 of the present invention, the expected current can be compared against the calculated current in real time. The variance between the expected and calculated current can be compared to component lifetime curves from the component manufacturer, in order to predict the remaining useable life of the components of the passive filter 10, and used to annunciate the near-term end of life of the passive filter. Thus, preventative maintenance is provided.

Additionally, the current in the line reactors 16 and tuned circuit reactors 18 can be monitored for overcurrent conditions by the monitoring device 22. The integrated control of the tuned circuit contactor 17 allows the monitoring device 22 to disengage the harmonic correction of the passive filter 10. This allows the controller device 22 to reduce the current in the tuned circuit 18, 20 to zero when an overload condition is detected, in order to avoid a thermal failure of the passive harmonic filter 10.

In general terms, the current in an inductor is equal to the integral of the voltage across the inductor, scaled by, 1 over the inductor's inductance value. Accordingly, the currents i(t) in the line reactors 16 and the tuned circuit reactors 18 are calculated fundamentally as follows.

$$i(t) = \frac{1}{L}\int v(t)dt + i(0)$$

Figure 6:
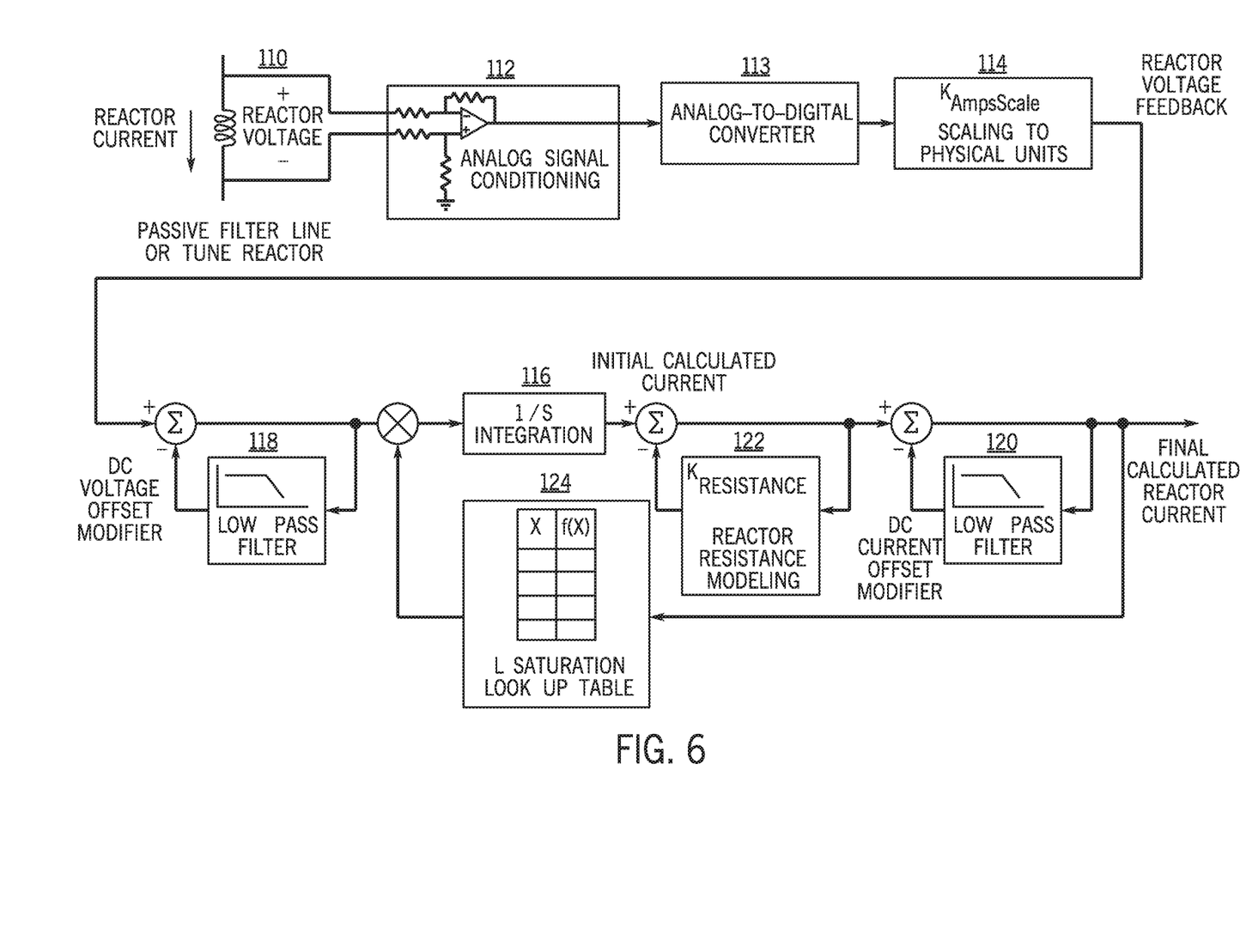
FIG. 6 is a flowchart showing the process for modeling the calculation of the reactor currents, based on the reactor voltages, for the apparatus shown in FIG. 2.

This basic equation describes the fundamental calculation of the reactor current from the reactor voltage, but does not model all aspects of real world reactors needed to get an accurate, useful estimate of the currents in the reactors 16, 18. First, practical and real-world reactors are not lossless and have a small amount of resistance inherent to the coil material and magnetic core material of the particular reactor. As shown in FIG. 6 (showing a single phase of either passive filter line reactor 16 or tuned circuit reactor 18, for simplicity), the reactor resistance is modeled in the calculation by applying a decay term to the voltage integration, as follows. Beginning with the measured voltage from the reactor 110, the voltage signal is conditioned at an analog signal conditioning circuit 112, and then converted from an analog signal to a digital signal at an A-D converter 113. Since the actual signal from the A-D converter 113 will only correspond proportionally to the voltage being measured, rather than being the voltage itself, the signal is put through a scaler 114 to convert the signal to physical units of voltage. From there, the signal passes to an integrator 116, to produce an initial calculated current.

Now, it is known that real-world analog signal conditioning circuits and analog-to-digital conversion circuits may sometimes contain signal offsets which do not exist in AC power systems. Left unaddressed, these signal offsets could accumulate in the integral calculation done at the integrator 116 and generate a large error signal. To remove these offsets, a continuous offset calculation is applied to the voltage at a voltage offset modifier 118 and a current offset modifier 120. This offset nulling removes the unwanted offsets, but also has the effect of limiting the lower frequency DC response of the current estimation. As long as any degradation of the current estimation occurs only low frequencies, such as below 10 Hz, such degradation is acceptable in power applications such as the present application, because the power systems to which passive harmonic filters are applied operate at frequencies of 50 Hz or above.

Finally, practical and real-world reactors do not have a fixed inductance value. Due to the saturation of the magnetic core material used to construct a reactor, the inductance of a reactor will decrease as the magnetic flux inside the reactor increases. Over the measurement range of the current estimation scheme presented here, the magnetic flux is proportional to the current in the reactor. The inductance saturation effect of the reactor is modeled at modeling unit 122 by scaling the contribution of the reactor voltage integration to the reactor current estimation, by means of an inductive saturation look-up table unit 124. The inductance saturation function of the look-up table unit 124 is based on historical engineering test data of the line reactors 16 and tuned circuit reactors 18 used in the passive harmonic filter 10.

Figure 4A:
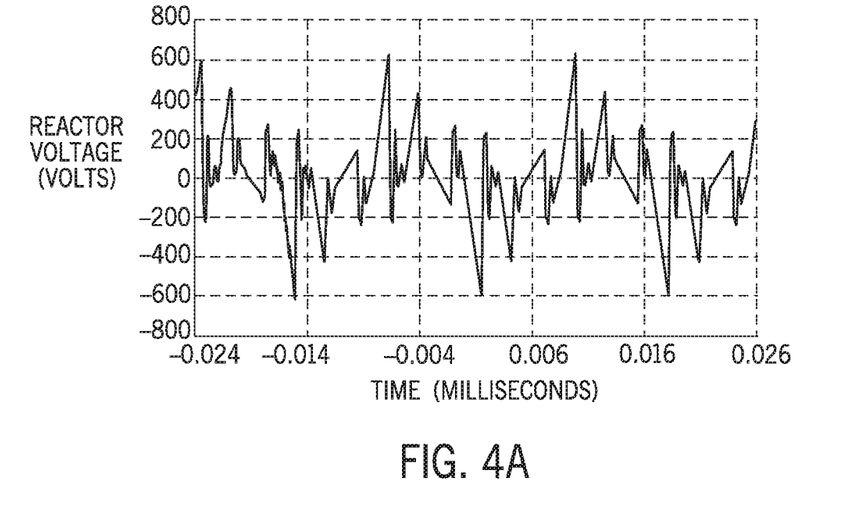
FIG. 4A is a graph showing a voltage waveform of a reactor in a passive harmonic filter.
Figure 4B:
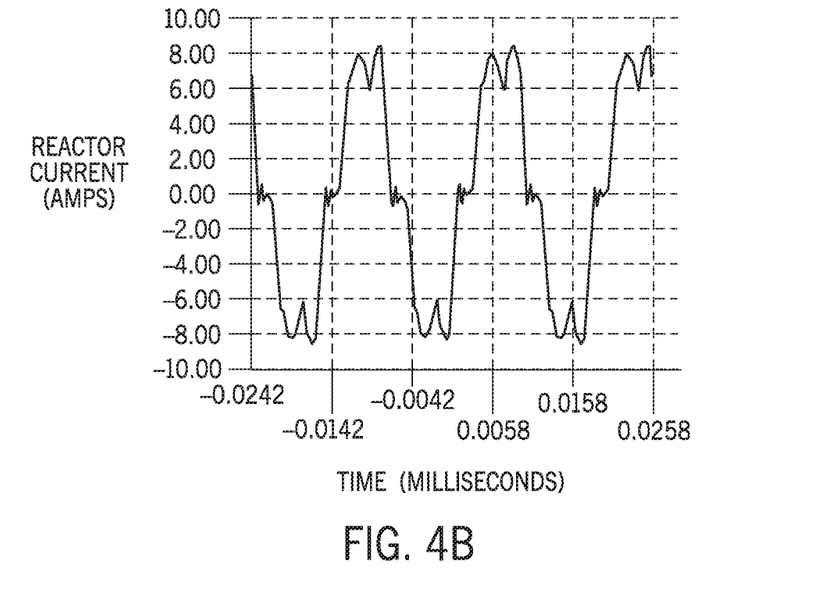
FIG. 4B is a graph showing a calculated or estimated current waveform for a correctly functioning passive harmonic filter.
Figure 4C:
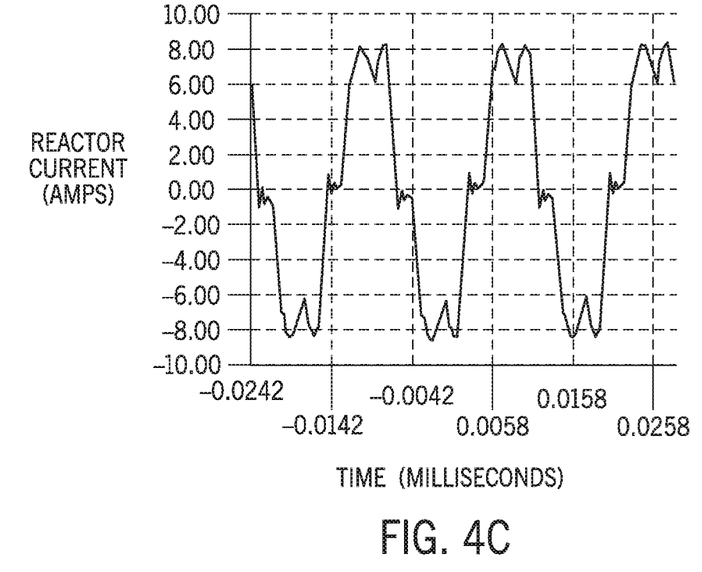
FIG. 4C is a graph showing a measured current waveform for a correctly functioning passive harmonic filter.
Figure 4D:
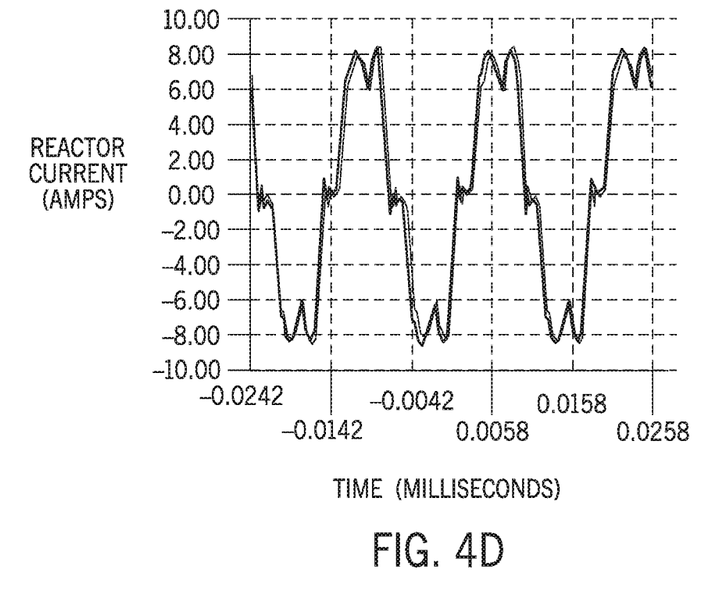
FIG. 4D is a graph showing a measured current waveform for a correctly functioning passive harmonic filter overlaid on an estimated current waveform for a correctly functioning passive harmonic filter.

FIG. 4A shows an example of a measured voltage across line reactor 16 from a passive filter connected to load constituted by a six-pulse rectifier supplying current to a VFD, in turn driving a 500-hp motor. Using the known line reactor inductance and the mathematical integration described above, FIG. 4B shows an example of an estimated current waveform for a correctly functioning passive harmonic filter, based upon the voltage waveform shown in FIG. 4A, and calculated by the controller device 22. FIG. 4C shows a calculated current waveform for a correctly functioning passive harmonic filter, based upon the voltage waveform shown in FIG. 4A, for comparison to the estimated current waveform shown in FIG. 4B. FIG. 4D shows the actual, measured, current waveform of FIG. 4C overlaid onto the estimated waveform shown in FIG. 4B. Thus it is shown that the method set forth above does predict and estimate, relatively accurately, what the actual currents will be, in a correctly functioning passive harmonic filter, again, based upon the voltage waveform shown in FIG. 4A. As indicated above, FIG. 1A shows the load current of a rectifier connected to a passive filter when the rectifier is operating correctly, whereas FIG. 1B shows a measured load current waveform for a malfunctioning rectifier connected to a passive harmonic filter, such as when one of the rectifier diodes 15 (FIG. 2) has failed and is no longer conducting.

Specifically, the way that is accomplished is that the harmonic spectrum components of a typical VFD rectifier load are stored in data tables internal to the DSP 24. These tables consist of the normalized magnitudes of expected fundamental current and harmonic currents at the odd, non-triplen harmonics of fundamental (i.e. $5^{th}$, $7^{th}$, $11^{th}$, $13^{th}$ . . . ) for a rectifier load where the fundamental current is 1.0 per unit and the harmonic currents are a fraction relative to the fundamental. The controller device 22 measures voltages as described above so as to calculate the load RMS and fundamental current, to thereby determine a measure of harmonic current distortion commonly known as Total Harmonic Distortion (THD). Using the load current THD, a specific harmonic current data table can be indexed that represents the measured THD. The template-indexed harmonic table components can be compared versus the continuously calculated harmonic components in the load current. The difference between the expected harmonic waveform and the calculated harmonic current waveform can be used to annunciate an error or fault condition. The thresholds for the fault detection are parameterized in the DSP to allow for adjustment based on unit size and power system differences such as power system voltage, frequency, and background voltage distortion. In addition to comparing the measured currents versus the harmonic template, basic over-current and over-voltage protection thresholds are also used to detect fault conditions. The over-voltage and over-current thresholds are parameterized in the DSP to allow for adjustment based on unit size and the power system to which the passive harmonic filter is connected. As stated above, multiple fault thresholds may be implemented as desired or desirable.

Figure 5:
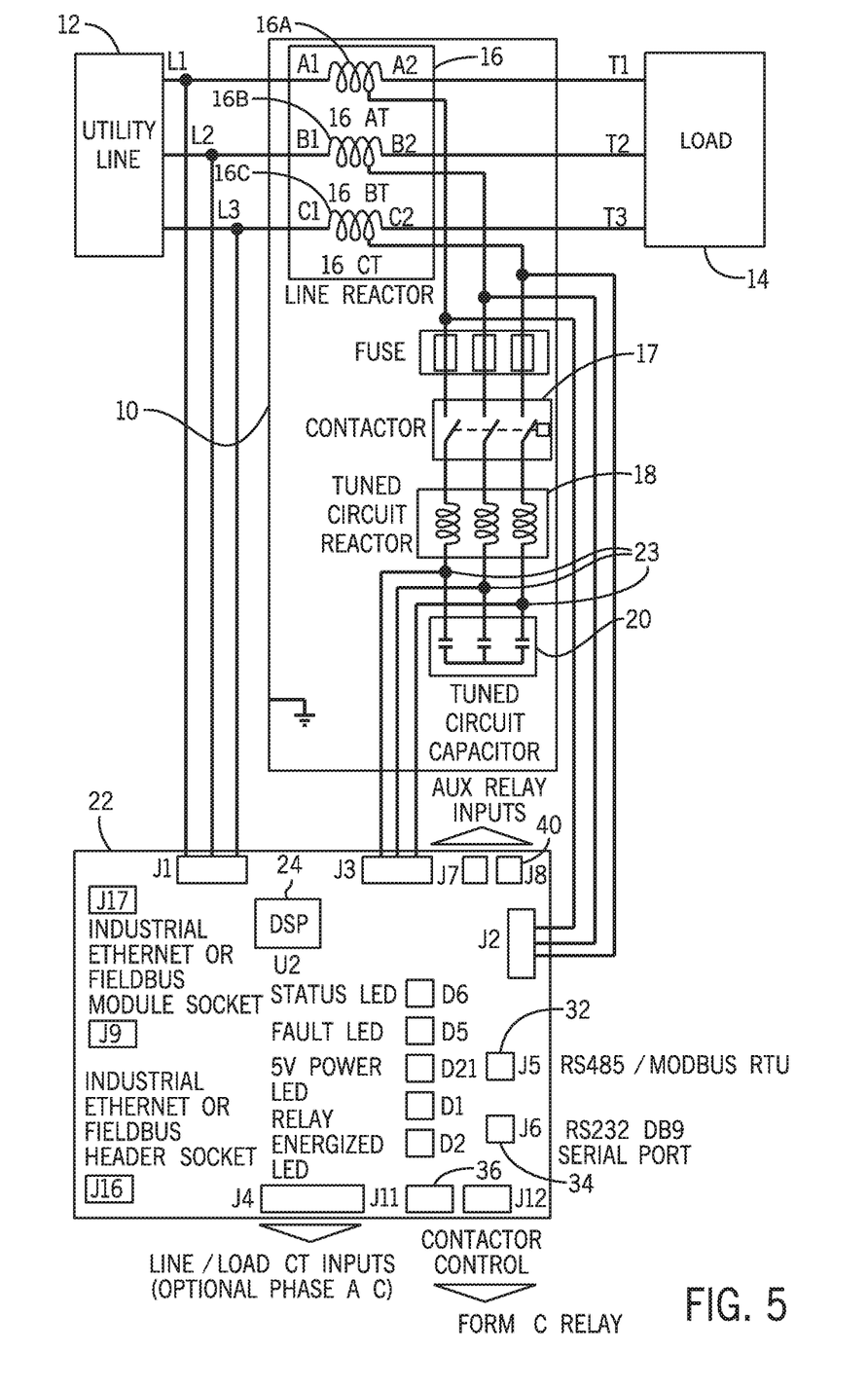
FIG. 5 is a schematic view of a passive harmonic filter having a controller connected thereto according to another embodiment of the invention.

Shown in FIG. 5, according to an alternative embodiment of the present invention, the same monitor or controller device 22 is applied to the same passive harmonic filter 10, but in a slightly different way. Controller device 22 is still connected to line input lines L1, L2 and L3 so as to obtain the input voltages from the power source 12. In this embodiment, however, controller device 22 is connected to inductor taps 16AT, 16BT and 16CT, rather than being connected to the load lines T1, T2 and T3. The result of this connection is that controller device 22 directly measures the tapped line reactor voltage. And controller device 22 is also still connected to the nodes 23 between the tuned circuit reactor 18 and the tuned circuit capacitor 20, and thus can directly measure the tuned circuit reactor voltage.

This different connection configuration is used for different types of passive harmonic filters. Certain passive harmonic filters, for example, Harmonic Guard Passive and Harmonic Shield product lines from TCI, LLC, use tapped reactors. In order to get a direct measurement of the line reactor voltage in that type of filter, voltage is measured from the input/line side of the reactor to the tap point, as shown in FIG. 5. Certain other types of passive harmonic filters, such as the HG7 product line from TCI, LLC, do not use a tapped reactor. For that product line, the controller device 22 would be connected as was shown in FIG. 2; that is, there is no reactor tap, so the controller device would be connected at the load side of line reactor.

Figure 7:
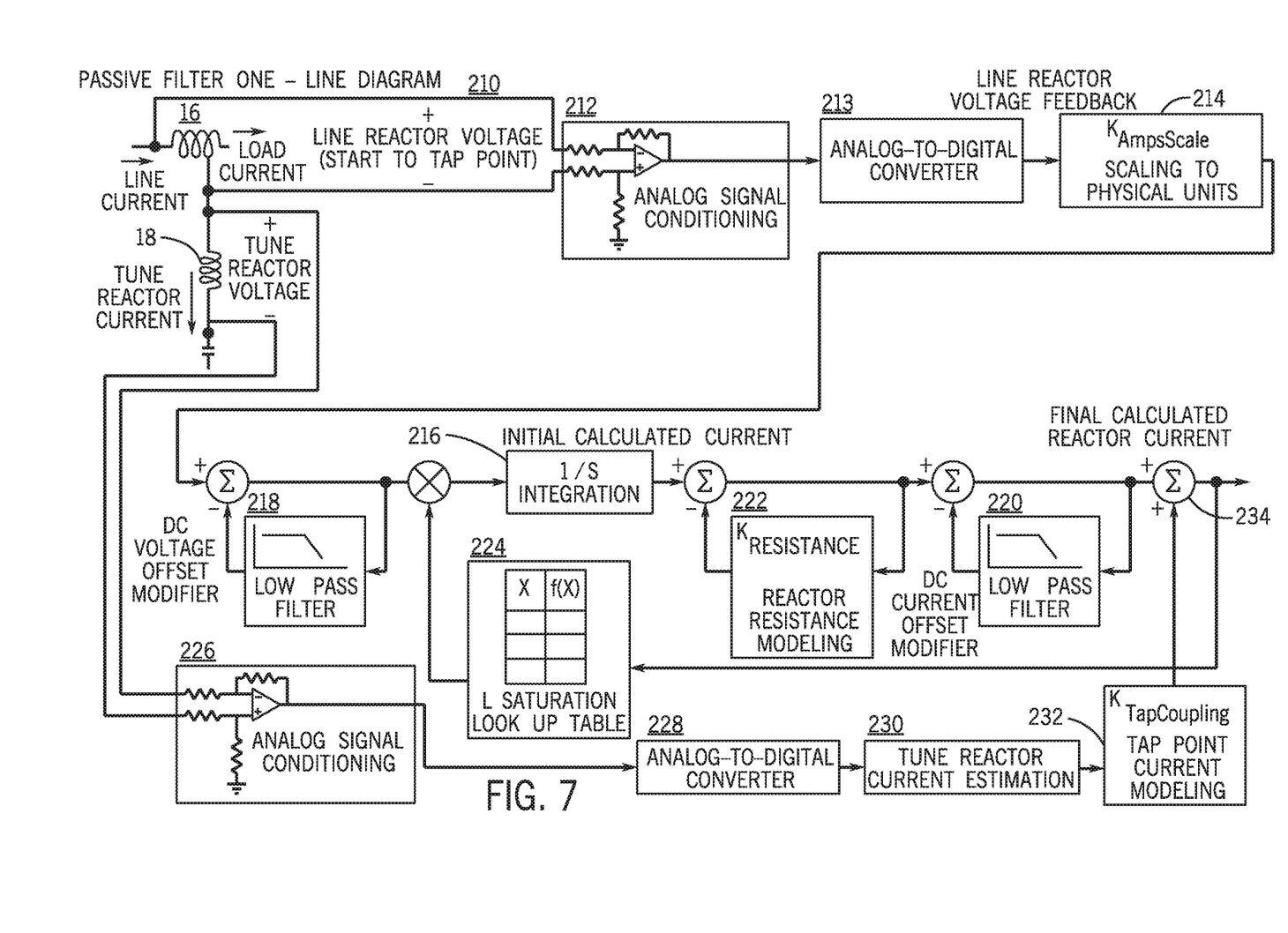
FIG. 7 is a flowchart showing the process for modeling the calculation of the reactor currents, based on the reactor voltages, for the apparatus shown in FIG. 5.

Compared to the connection shown in FIG. 2, when connected to a tap connection of the line reactors, as shown in FIG. 5, an additional consideration is required to more accurately calculate the line current from the reactor voltage. As is known, a tapped reactor has a third electrical connection, called the tap, in addition to the normal start and finish electrical connections of the reactor. As shown in FIG. 7, the tap voltage 210 is measured from the starting winding to the tap point (16AT, 16BT, 16CT, shown in FIG. 5), including only a portion of the entire winding of the line reactor 16 (again, shown only in one phase, for simplicity). This tap voltage is conditioned at an analog signal conditioner 212, and converted to a digital signal by an analog-to-digital converter 213. Here again, since the actual signal from the A-D converter 213 will only correspond proportionally to the voltage being measured, rather than being the voltage itself, the signal is put through a scaler 214 to convert the signal to physical units of voltage. From there, the signal passes to an integrator 216, to produce an initial calculated "tap" current. And here again, real-world analog signal conditioning circuits and analog-to-digital conversion circuits will likely contain signal offsets which do not exist in AC power systems. So a continuous offset calculation is applied to the voltage at a voltage offset modifier 218 and a current offset modifier 220. And again, the inductance saturation effect of the reactor is modeled at modeling unit 222 by scaling the contribution of the reactor voltage integration to the reactor current estimation, by means of an inductive saturation look-up table unit 224, the inductance saturation function of the look-up table unit being based on historical engineering test data of the tapped line reactors 16, and the tuned circuit reactors 18.

In this instance, because of the tapped connection, when calculating the currents in a tapped line reactor 16, the contribution of the current sourced or sinked at the tap point connection 16AT, 16BT, 16CT needs to factored in. In the case of the tapped line reactor current calculation, the tap current is added to the total current estimation at a ratio of (a) the tap-to-finish turns of the reactor, over (b) the full start-to-finish turns of the reactor. So, once again, the voltage over the tuned circuit reactor 18 is conditioned at analog signal conditioner 226, and converted to a digital signal by an analog-to-digital converter 228. The current in the tuned circuit reactor 18 is then estimated at estimator 230. Estimator 230 basically corresponds to the majority of the circuit shown in FIG. 6, namely, elements 114-124, and produces a current figure calculated from the voltage across tuned circuit reactor 18.

As referred to above, the current figure produced at estimator 230 is then factored at modeler 232, according to the ratio of the tap-to-finish turns of the reactor to the full start-to-finish turns of the reactor, so that the appropriate proportion of the current is then summed at junction 234 with the calculated current from the tapped portion of line reactor 16, to result in the final calculated reactor current. Thus, all the turns of the line reactor 16 are accounted for, in one or the other of the portions of the circuit shown in FIG. 7, in measuring the voltage drop and calculating the current in the line reactor.

The monitoring and control circuit described herein could also be put to the following uses, as examples.

Facility harmonics sensing could be provided, based upon sensing line reactor voltage installed at a facility feed. In addition to the application of the monitor and communications device to a passive filter, the device can also be applied as a stand-alone add-on to line reactors installed to reduce harmonics within facilities. The device would use the same voltage-based current sensing as implemented in the passive filter, to provide status and metering data of facility power without the need for traditional current transducers or expensive current transformers.

The tuned circuit contactor 17 could be controlled based on power factor. For passive filter tuned circuit contactor control, the common practice is to have an external controller, such as a variable frequency drive or a Programmable Logic Controller (PLC), control the tuned circuit contactor 17. The external controller pulls in and drops out the tuned circuit 18 based on the load level. The primary reason the tuned circuit 18 is disabled by the contactor 17 is to avoid leading power factor at light load. The tuned circuit 18 of the passive filter 10, which sources the 5th harmonic distortion current and power factor correcting reactive current required by the load 14, is sized for full load. At light load the load 14 does not fully consume the leading reactive current generated by the tuned circuit 18. This situation results in leading power factor at the source. In practice, leading power factor at the source is generally benign, but in extreme cases, it can contribute to grid instability and generator control issues. The passive filter monitor device 22 disclosed here can be configured to operate the contactor 17 directly, based on the resultant power factor at the passive filter line 12 connection, which is advantageous compared to operating the contactor based on indirect load conditions. The monitor device 22 calculates the net reactive current left after the load demand consumption in real time, and can turn on or off the tuned circuit 18 based on a pre-defined source power factor set-point. This allows the passive filter 10 to maximize the amount of time the harmonic correction is online, without causing leading power factor, and at the same time avoiding any real or perceived application issues of grid or generator start up stability caused by the passive harmonic filter.

Control of the tuned circuit contactor control can be based on Total Demand Distortion (TDD). The primary power quality standard enforced by utilities on industrial and commercial customers in North America is IEEE-519. IEEE-519 describes maximum allowed harmonic current distortion allowed at the customer point of common coupling with the utility. The harmonic limits in the standard are defined relative to the maximum current capability of a source. This harmonic measurement is described as Total Demand Distortion (TDD). The TDD measurement of distortion relative to the source capability is fundamentally different than the more common measure of harmonic distortion relative to the load current, which is Total Harmonic Distortion (THD). The passive filter monitoring device described herein continuously calculates the TDD of the source and can be configured to turn on the tuned circuit contactor only when required to meet the set TDD limit of the application. Similar to the power factor control of the tuned circuit contactor, as described above, this usage allows the passive filter to avoid causing leading power factor while still meeting the IEEE-519 standard. Thus the monitoring device described herein is capable of avoiding any real or perceived application issues of passive harmonic filters and grid or generator start up instability. Minimizing the operation of the tuned circuit components, in this example to only those instances when they are needed to meet TDD limits, also extends the useable lifetime of the tuned circuit components.

The passive filter monitor board continuously calculates the TDD of the source and can be configured to turn on the tuned circuit contactor only when required to meet the set TDD limit of the application. Similar to the power factor control of the tuned circuit contactor this allows the passive filter to avoid causing leading power factor while still meeting the IEEE-519 standard and thus avoids any real or perceived application issues of passive harmonic filters and grid or generator start up stability. Minimizing the operation of the tuned circuit components to only when they are needed to meet TDD limits also extends the useable lifetime of the tuned circuit components.

Using the above-described concepts, the passive filter monitoring device described herein may be applied on a broader scale. For instance, multiple passive harmonic filters may be networked where each filter includes a monitoring device as described herein. By this means, the aggregate power factor, or the aggregate TDD, can be controlled. The passive harmonic filter monitoring device described herein includes a serial communications interface. This interface allows status data to be read from the filter, and accepts configuration and control commands to be sent to the filter. A network of monitoring-device-enabled passive harmonic filters could be controlled by an overall control/monitoring unit, in order to control the aggregate power factor or total demand distortion of the entire system instead of each individual load independently. A networked collection of passive harmonic filter enhances system reliability by providing redundancy in the event of a single unit failure and the ability to load level the wear on individual units by cycling through units and putting some units off line to preserve their useful lifetime when not all the corrective capability is required.

Although the invention has been herein described in what is perceived to be the most practical and preferred embodiments, it is to be understood that the invention is not intended to be limited to the specific embodiments set forth above. Rather, it is recognized that modifications may be made by one of skill in the art of the invention without departing from the spirit or intent of the invention and, therefore, the invention is to be taken as including all reasonable equivalents to the subject matter of the appended claims and the description of the invention herein.

What is claimed is:

1. A monitoring device for application to a passive harmonic filter connected to a source and to a load, the passive harmonic filter having a line reactor with inductor taps, the line reactor connected between the source and the load, the passive harmonic filter further having a tuned circuit reactor and a tuned circuit capacitor connected in series with each other and parallel to the line reactor, the monitoring device comprising:
   a digital signal processor;
   a connector connected between the digital signal processor and the source, to enable the digital signal processor to obtain a voltage at the source;
   a connector connected between the digital signal processor and the inductor taps of the line reactor, to enable the digital signal processor to obtain a voltage at the inductor taps;
   a connector connected between the digital signal processor and a node between the tuned circuit reactor and the tuned circuit capacitor to obtain a voltage across the tuned circuit reactor; and
annunciation means by which the digital signal processor announces a failure of the passive harmonic filter in the event that the digital signal processor determines the existence of the failure.

* * * * *